(12) United States Patent
Hamada et al.

(10) Patent No.: US 11,587,614 B2
(45) Date of Patent: Feb. 21, 2023

(54) READ SPIKE MITIGATION IN INTEGRATED CIRCUIT MEMORY

(71) Applicant: Micron Technology, Inc., Boise, ID (US)

(72) Inventors: Josephine Tiu Hamada, Folsom, CA (US); Kenneth Richard Surdyk, Folsom, CA (US); Lingming Yang, Meridian, ID (US); Mingdong Cui, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/394,778

(22) Filed: Aug. 5, 2021

(65) Prior Publication Data

US 2021/0366540 A1    Nov. 25, 2021

Related U.S. Application Data

(62) Division of application No. 16/660,569, filed on Oct. 22, 2019, now Pat. No. 11,114,156.

(51) Int. Cl.
| | | |
|---|---|---|
| *G11C 11/16* | (2006.01) | |
| *G11C 11/56* | (2006.01) | |
| *G11C 11/4074* | (2006.01) | |

(52) U.S. Cl.
CPC ...... *G11C 11/5678* (2013.01); *G11C 11/4074* (2013.01); *G11C 11/5628* (2013.01); *G11C 11/5642* (2013.01)

(58) Field of Classification Search
CPC ............ G11C 11/5678; G11C 11/4074; G11C 11/5628; G11C 11/5642; G11C 2013/0073; G11C 13/0026; G11C 13/0028; G11C 13/004; G11C 13/0061; G11C 13/0069; G11C 16/08; G11C 16/24; G11C 16/26; G11C 16/32; G11C 7/12; G11C 8/08; G11C 2207/063; G11C 7/067

See application file for complete search history.

(56) References Cited

U.S. PATENT DOCUMENTS

| | | |
|---|---|---|
| 9,396,795 B1 | 7/2016 | Jeloka et al. |
| 11,114,156 B2 | 9/2021 | Hamada et al. |
| 2004/0240250 A1 | 12/2004 | Karasawa et al. |
| 2008/0112211 A1 | 5/2008 | Toda |
| 2009/0201740 A1 | 8/2009 | Wilier et al. |
| 2010/0165702 A1 | 7/2010 | Toda |
| 2011/0141794 A1 | 6/2011 | Kurosawa et al. |
| 2014/0131653 A1 | 5/2014 | Lee et al. |
| 2017/0125097 A1 | 5/2017 | Tortorelli et al. |

(Continued)

OTHER PUBLICATIONS

International Search Report and Written Opinion, PCT/US2020/055565, dated Jan. 26, 2021.

*Primary Examiner* — Hien N Nguyen

(74) *Attorney, Agent, or Firm* — Greenberg Traurig

(57) ABSTRACT

An integrated circuit memory device, having: a first wire; a second wire; a memory cell connected between the first wire and the second wire; a first voltage driver connected to the first wire; and a second voltage driver connected to the second wire. During an operation to read the memory cell, the second voltage driver is configured to start ramping up a voltage applied on the second wire after the first voltage driver starts ramping up and holding a voltage applied on the first wire.

20 Claims, 4 Drawing Sheets

(56) References Cited

U.S. PATENT DOCUMENTS

| | | |
|---|---|---|
| 2019/0020649 A1 | 1/2019 | Banga et al. |
| 2021/0118497 A1* | 4/2021 | Hamada et al. |
| 2021/0118501 A1* | 4/2021 | Cui .................... G11C 13/0028 |
| 2021/0134363 A1* | 5/2021 | Sirocka .................... G11C 8/08 |

* cited by examiner

READ SPIKE MITIGATION IN INTEGRATED CIRCUIT MEMORY

RELATED APPLICATIONS

The present application is a divisional application of U.S. patent application Ser. No. 16/660,569 filed Oct. 22, 2019, the entire disclosures of which application are hereby incorporated herein by reference.

FIELD OF THE TECHNOLOGY

At least some embodiments disclosed herein relate to voltage drivers for applying voltages to memory cells in general and more particularly, but not limited to, operations of the voltage drivers to reduce read disturb in memory cells during read operations.

BACKGROUND

A memory integrated circuit can have one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc.

Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a phase-change memory device and a select device that are stacked together as a column in an integrated circuit. Memory cells of such columns are connected in the integrated circuit via two layers of wires running in directions that are perpendicular to each other. One of the two layers is above the memory cells; and the other layer is below the memory element columns. Thus, each memory cell can be individually selected at a cross point of one wire on each of the two layers. Cross point memory devices are fast and non-volatile and can be used as a unified memory pool for processing and storage.

A non-volatile integrated circuit memory cell can be programmed to store data by applying one voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determine whether the memory cell becomes conductive at a voltage corresponding to a pre-defined state.

The voltage(s) applied to read a memory cell in an integrated circuit can disturb the state of the memory cell and/or nearby memory cells in the integrated circuit. The read disturb effect can cause errors in retrieving data from the nearby memory cells.

BRIEF DESCRIPTION OF THE DRAWINGS

The embodiments are illustrated by way of example and not limitation in the figures of the accompanying drawings in which like references indicate similar elements.

DETAILED DESCRIPTION

At least some embodiments disclosed herein provide systems, methods and apparatus to reduce read disturb in non-volatile integrated circuit memory.

In some implementations, cross point memory can use a memory cell that has a select device but no phase-change memory device. For example, the memory cell can be a single piece of alloy with variable threshold capability. The read/write operations of such a cell can be based on thresholding the cell while inhibiting other cells in subthreshold bias, in a way similar to the read/write operations for a memory cell having a select device and a phase-change memory device that are stacked together as a column.

Such a memory cell, having a select device but no phase-change memory device, can be programmed in cross point memory to have a threshold voltage window. The threshold voltage window can be created by applying programming pulses with opposite polarity to the select device. For example, the select device can be biased to have a positive voltage difference between two sides of the select device and alternatively, to have a negative voltage difference between the same two sides of the select device. When the positive voltage difference is considered in positive polarity, the negative voltage difference is considered in negative polarity that is opposite to the positive polarity. Reading can be performed with a given/fixed polarity. When programmed, the memory cell has a threshold lower than the cell that has been reset, such that during a read operation, the read voltage can cause a programmed cell to become conductive while a reset cell remains non-conductive.

The voltage stress applied on a reset cell in a time period to determine whether or not the cell is conductive can reduce the voltage threshold of the reset cell. When the voltage threshold is sufficiently reduced after multiple read operations, the cell can become conductive during the read operation, which can lead an incorrect read of the state of the cell.

To reduce the read disturb caused by the voltage stress, the ramping up of the voltage applied on one side of the memory cell can be delayed for a period following the ramping up of the voltage applied on the other side of the memory cell. For example, before ramping up the voltage applied on a wordline, the voltage driver for a bitline can ramp up the voltage applied on the bitline. Then, the voltage driver for a bitline holds the voltage on the bitline, while the voltage driver for the wordline ramps up the voltage on the wordline for selection. The delay of the ramping up of the voltage on the wordline and the sequential ramping up of voltages on two sides of the memory cell can reduce voltage stress and thus read disturb.

Figure 1:
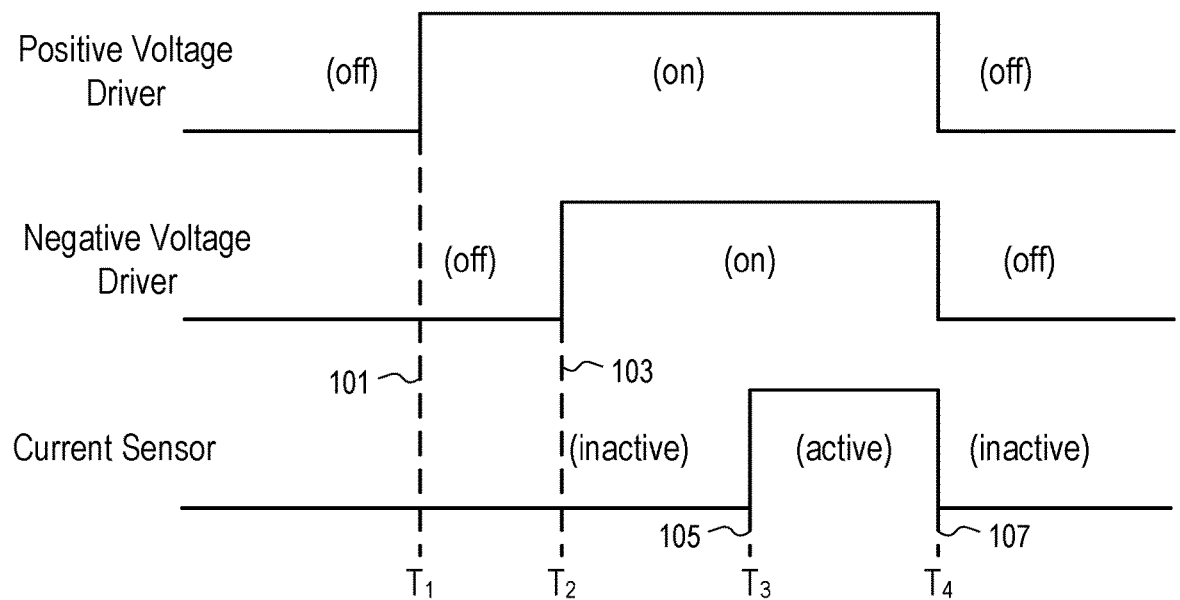
FIG. 1 shows the technique of delaying the ramping up of a voltage from one side of a memory cell to reduce read disturb according to some embodiments.

FIG. 1 shows the technique of delaying the ramping up of a voltage from one side of a memory cell to reduce read disturb according to some embodiments.

Two voltage drivers can be configured in cross point memory to apply voltages respectively to the two sides of a memory cell. For example, a positive voltage driver can apply a positive voltage to one side of the memory cell; and a negative voltage driver can apply a negative voltage to the other side of the memory cell.

The memory cell is addressed when both the positive and negative voltage drivers are turned on to apply the positive and negative voltages to the two sides of the memory cell. The memory cell is not addressed for reading when at least one of the positive and negative voltage drivers does not ramp up its voltage.

FIG. 1 illustrates a configuration where the negative voltage driver is turned on at a time T2 (103) after the positive voltage driver is turned on at time T1 (101), such that the negative voltage driver and the positive voltage drivers are not turned on simultaneously. The delay between T1 (101) and T2 (103) allows the reduction of voltage stress applied on the memory cell during the operation of reading the state of the memory cell.

In FIG. 1, when both the positive and negative voltage drivers are turned on after T2 (103), a current sensor can be activated to determine whether the memory cell is conductive during the time period between T3 (105) and T4 (107). Whether the memory cell is conductive reveals the state of the memory cell.

Figure 2:
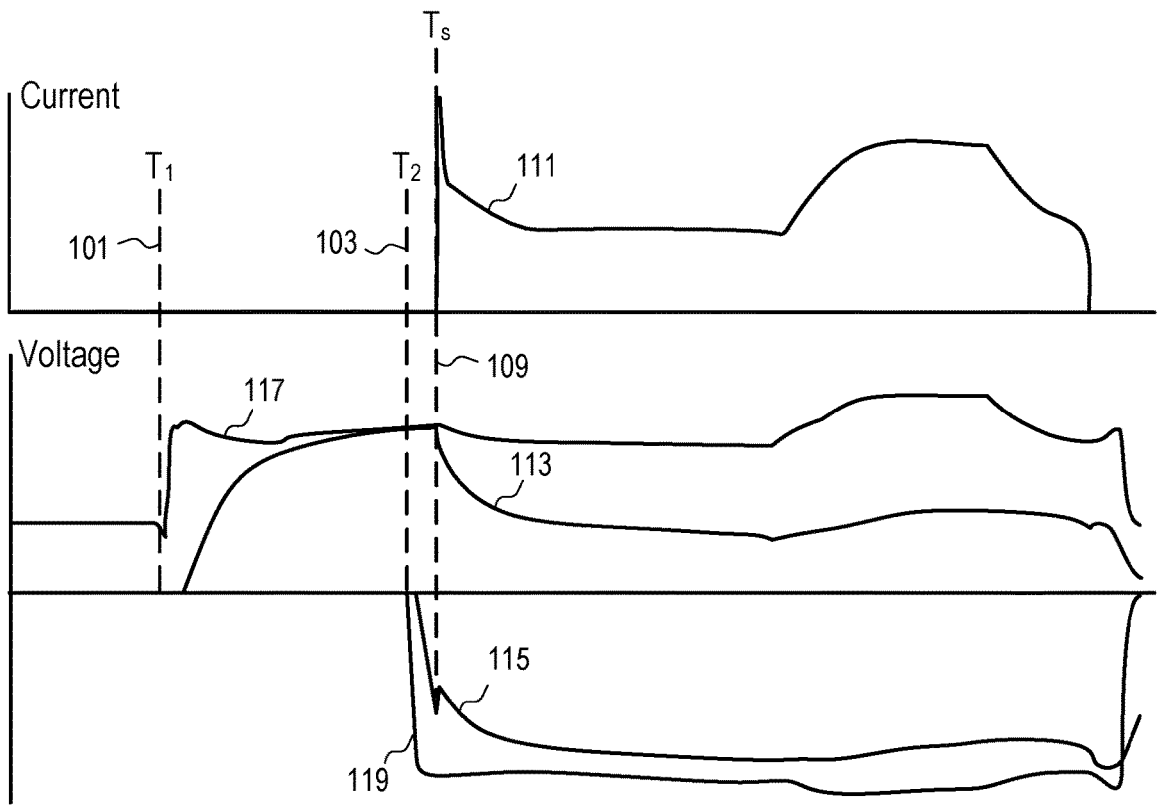
FIGS. 2-4 illustrate the effect of voltage and current waveforms associated with delaying the ramping up of a voltage from one side of a memory cell according to one embodiment.
Figure 3:
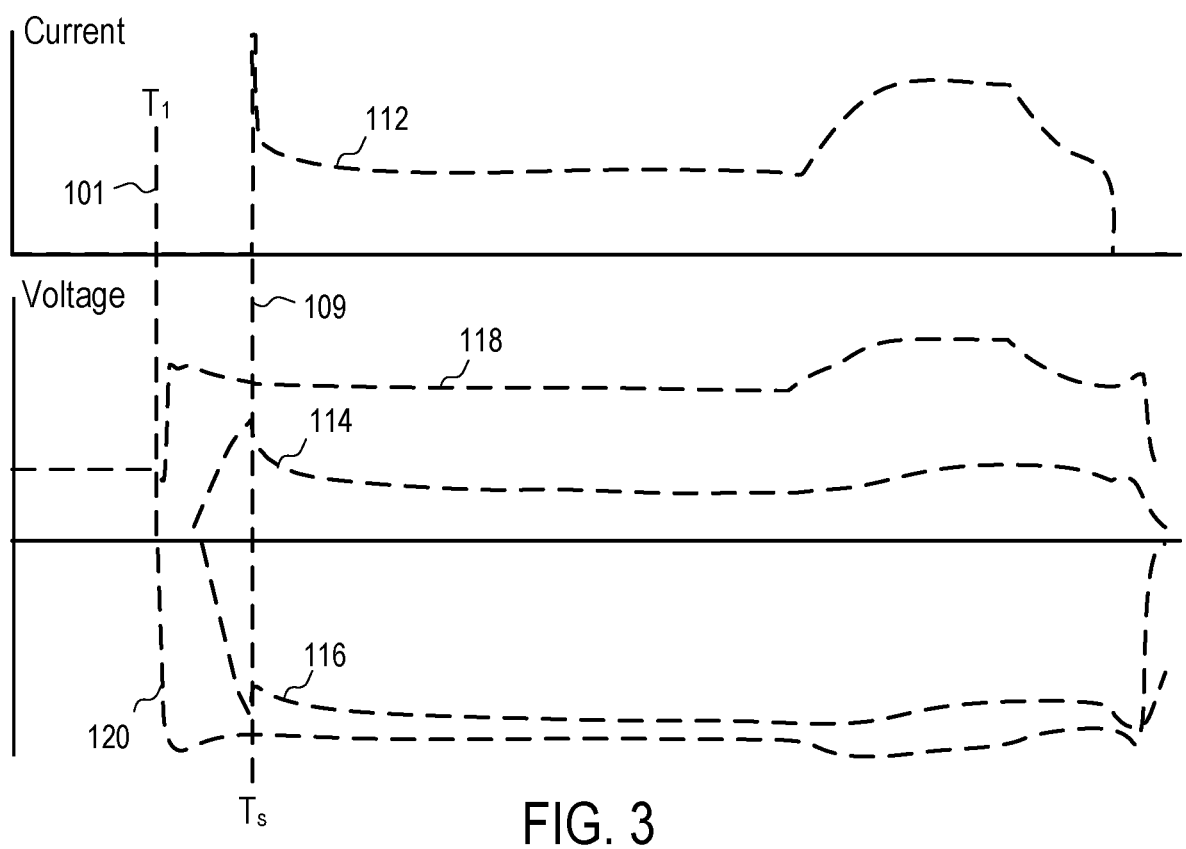
Figure 4:
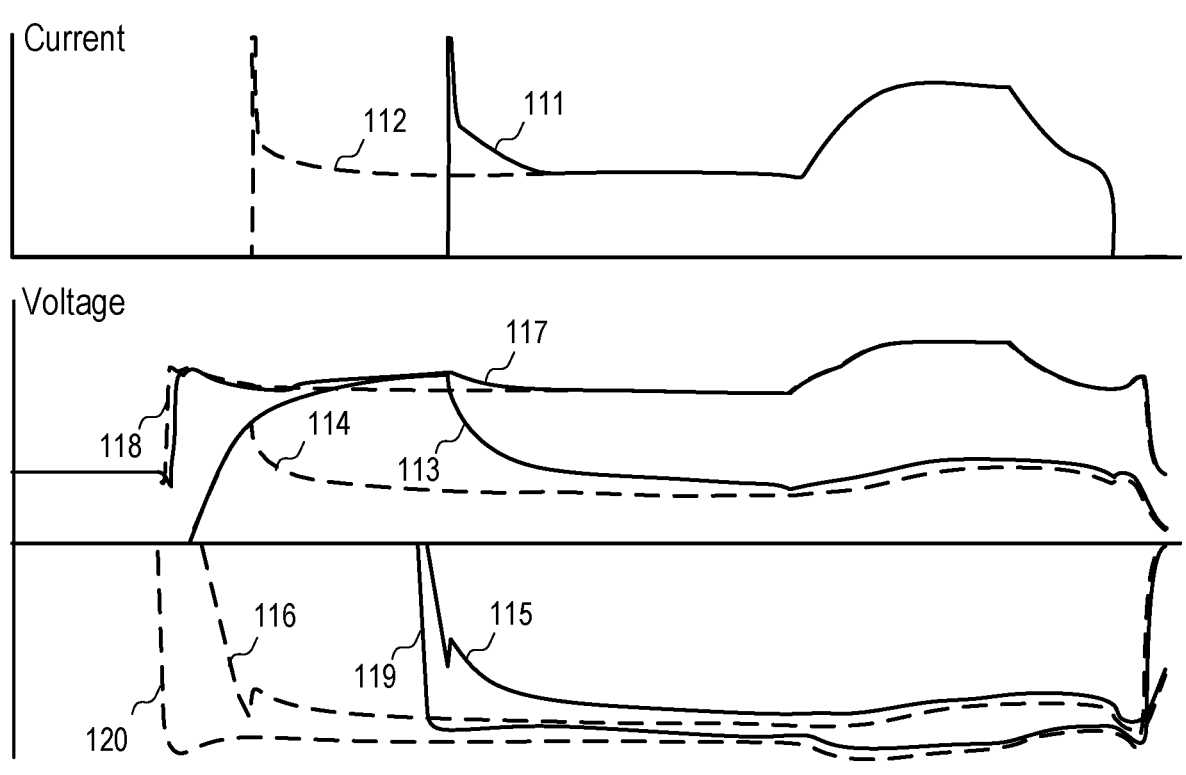

FIGS. 2-4 illustrate the effect of voltage and current waveforms associated with delaying the ramping up of a voltage from one side of a memory cell according to one embodiment.

In FIG. 2, the positive voltage driver starts at time T1 (101) to drive up a positive voltage according to a waveform (117) from a predetermined voltage (e.g., 1V). After a time period, the negative voltage driver starts at time T2 (103) to drive up a negative voltage according to a waveform (119). The waveforms (117 and 119) illustrate a scenario where the memory cell has a high threshold voltage and thus remains non-conductive after both the positive and negative voltage drivers are active to drive up voltage magnitudes.

In another scenario, the positive voltage driver starts at time T1 (101) to drive up a positive voltage according to a waveform (113) from another predetermined voltage (e.g., 0V).

After a time period (e.g., close to time T2), the waveform (113) reaches to a level similar to that of the waveform (117) that starts from the higher initial voltage (e.g., 1V). The negative voltage driver starts at time T2 (103) to drive up a negative voltage according to a waveform (115). The waveforms (113 and 115) illustrate a scenario where the memory cell has a low threshold voltage and becomes conductive at time Ts (109) after both the positive and negative voltage drivers are active to drive up voltage magnitudes. The waveform (111) illustrates the current going through the memory cell. The current going through the memory cell reduces the voltages (113 and 115) driven by the positive and negative voltage drivers.

In contrast, FIG. 3 illustrates the waveforms of voltages and current where the positive and negative voltage drivers start to ramp up positive and negative voltages simultaneously at time T1 (101). The waveforms (118 and 120) in FIG. 3 correspond to the waveforms (117 and 119) in FIG. 2 for the scenario where the memory cell has a high threshold voltage and thus remains non-conductive after both the positive and negative voltage drivers are active to drive up voltage magnitudes.

The waveforms (114 and 116) of FIG. 3 correspond to the waveforms (113 and 115) of FIG. 2 for the scenario where the memory cell has a low threshold voltage and becomes conductive at time Ts (109) after both the positive and negative voltage drivers are active to drive up voltage magnitudes. The waveform (112) illustrates the current going through the memory cell, which is similar to the waveform (111) of current going through the memory cell. The current going through the memory cell reduces the voltages (114 and 116) driven by the positive and negative voltage drivers.

FIG. 4 shows the comparison between the waveforms (111, 113, 115, 117, and 119) of delayed ramping up of negative voltage and the corresponding waveforms (112, 114, 116, 118, and 120) of simultaneously ramping up of both positive and negative voltages.

Although the waveforms (111, 113, 115, 117, and 119) and the corresponding waveforms (112, 114, 116, 118, and 120) are substantially the same after a period of time, there are significant differences in waveforms during the time period of ramping up of the voltages and in the time period in which the memory cell of a low threshold voltage becomes conductive. For a memory cell having a high voltage threshold, the positive voltage curves (117 and 118) are substantially the same, while the negative voltage curve (119) of the delayed ramping up has less voltage stress than the negative voltage curve (120) without the delay in ramping up.

Experiments showed that delaying the ramping up of negative voltage until after the ramping up of positive voltage can reduce read spike in voltage stress and thus reduce read disturb.

Figure 5:
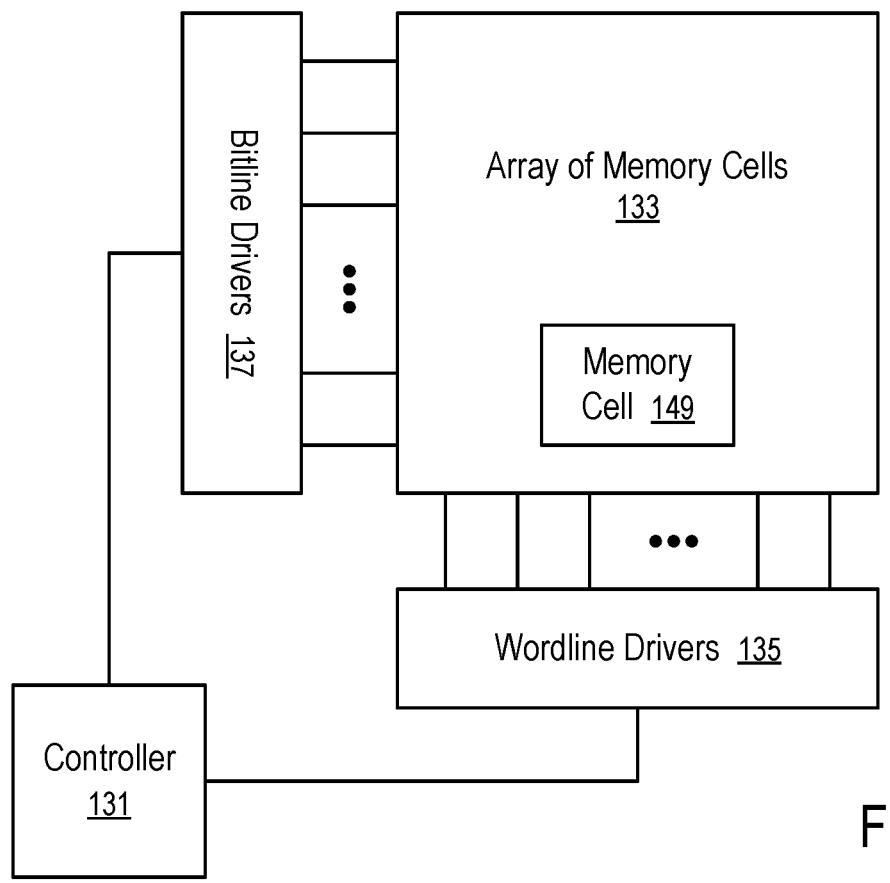
FIG. 5 shows a memory device configured with drivers to implement voltage operations for reduced read disturb according to one embodiment.

FIG. 5 shows a memory device configured with drivers to implement voltage operations for reduced read disturb according to one embodiment.

In FIG. 5, the memory device includes an array (133) of memory cells (e.g., 149). For example, a typical memory cell (e.g., 149) in the array (133) can have a select device and no phase-change memory device; the memory cell (149) is programmable to store data via applying pulses with opposite polarity; and during an operation to read the memory cell (149), voltages of a predetermined, fixed polarity are applied on the memory cell (149).

The memory device of FIG. 5 includes a controller (131) that operates bitline drivers (137) and wordline drivers (135) to access the individual memory cells (e.g., 149) in the array (133).

The bitline drivers (137) and/or the wordline drivers (135) can include a delayed operation in ramping up its voltage applied to a memory cell (e.g., 149).

Figure 6:
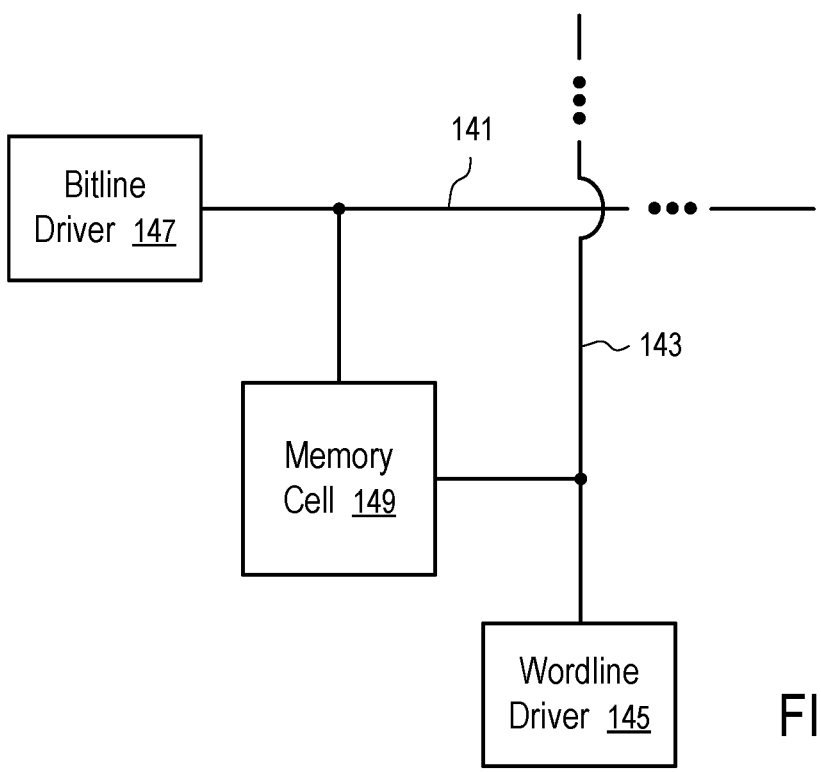
FIG. 6 shows a memory cell with a bitline driver and a wordline driver configured to implement voltage operations to reduce disturb according to one embodiment.

For example, each memory cell (e.g., 149) in the array (133) can be accessed via voltages driven by a pair of a bitline driver and a wordline driver, as illustrated in FIG. 6.

FIG. 6 shows a memory cell (149) with a bitline driver (147) and a wordline driver (145) configured to implement voltage operations to reduce disturb according to one embodiment.

For example, the bitline driver (147) drives on a bitline wire (141) a first voltage applied to a row of memory cells in the array (133); and the wordline driver (145) drives on a wordline wire (143) a second voltage applied to a column of memory cells in the array (133). A memory cell (149) in the row and column of the memory cell array (133) is subjected to the voltage difference between the first voltage driven by the bitline driver (147) and the second voltage driven by the wordline driver (145). When the first voltage is higher than the second voltage, the memory cell (149) is subjected to one voltage polarity (e.g., positive polarity); and when the first voltage is lower than the second voltage, the memory cell (149) is subjected to an opposite voltage polarity (e.g., negative polarity).

One of the bitline driver (147) and the wordline driver (145) can include a delayed ramping up operation relative to the other one to reduce read disturb. For example, the bitline driver (147) can delay ramping up its voltage until after the wordline driver (145) has ramped up its voltage. Alternatively, the wordline driver (145) can delay ramping up its voltage after the bitline driver (147) has ramped up its voltage.

During the read operation, both the bitline driver (147) and the wordline driver (145) can drive voltages of increasing magnitude by with opposite signs.

For example, in an operation of positive polarity, the bitline driver (147) can be configured to drive a positive voltage with increasing magnitude to read the memory cell (149); and the wordline driver (145) can be configured to drive a negative voltage with increasing magnitude to read the memory cell (149). The difference between the voltage driven by the bitline driver (147) and the voltage driven by the wordline driver (145) corresponds to the voltage applied on the memory cell (149). The wordline driver (145) can delay ramping up its voltage until after the bitline driver (147) has ramped up its voltage to reduce read disturb.

For example, in an operation of negative polarity, the bitline driver (147) can be configured to drive a negative voltage with increasing magnitude to read the memory cell (149); and the wordline driver (145) can be configured to drive a positive voltage with increasing magnitude to read the memory cell (149). The difference between the voltage driven by the bitline driver (147) and the voltage driven by the wordline driver (145) corresponds to the voltage applied on the memory cell (149). The bitline driver (147) can delay ramping up its voltage until after the wordline driver (145) has ramped up its voltage to reduce read disturb.

When the bitline driver (147), the wordline driver (145), or both do not ramp up their voltages, the memory cell (149) is not addressed for reading its state.

The bitline drivers (137) can be used to drive parallel wires (e.g., 141) arranged in one direction and disposed in one layer of cross point memory; and the wordline drivers (135) can be used to drive parallel wires (e.g., 143) arranged in another direction and disposed in another layer of the cross point memory. The wires (e.g., 141) connected to the bitline drivers (e.g., 147) and the wires (e.g., 143) connected to the wordline drivers (e.g., 145) run in the two layers in orthogonal directions. The memory cell array (133) is sandwiched between the two layers of wires; and a memory cell (e.g., 149) in the array (133) is formed at a cross point of the two wires (e.g., 141 and 143) in the integrated circuit die of the cross point memory.

Figure 7:
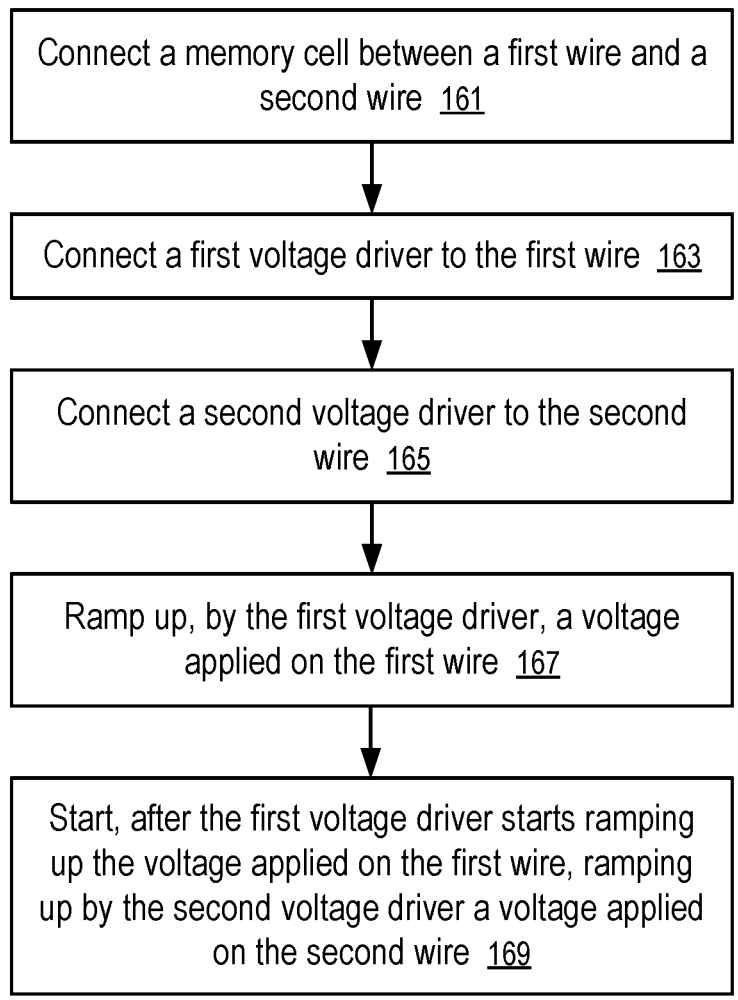
FIG. 7 shows a method to apply a read voltage on a memory cell according to one embodiment.

FIG. 7 shows a method to apply a read voltage on a memory cell according to one embodiment. For example, the method of FIG. 7 can be implemented in a memory device of FIG. 5 with delayed operation of ramping up voltages on one side of a memory cell in ways as illustrated in FIGS. 1-4.

At block 161, an integrated circuit memory device connects a memory cell (149) between a first wire (141) and a second wire (143).

At block 163, the integrated circuit memory device connects a first voltage driver (147) to the first wire (141).

At block 165, the integrated circuit memory device connects a second voltage driver (145) to the second wire (143).

For example, the integrated circuit memory device can include cross point memory containing the memory cell (149). The memory cell (149) can include a select device but no phase-change memory device; and the memory cell (149) is programmable to store data via applying pulses with opposite polarity. During the operation to read the memory cell (149), the first and second voltage drivers (147 and 145) drive voltages on the first and second wires (141 and 143) according to a predetermined, fixed polarity.

For example, the first wire (141) and the second wire (143) run in perpendicular directions in two layers of an integrated circuit die; and the memory cell (149) is formed in the integrated circuit die as a column between the two layers at the cross point of the first wire (141) and the second wire (143).

At block 167, the first voltage driver (147) ramps up a voltage (113 or 117) applied on the first wire (141).

At block 169, after the first voltage driver (147) starts ramping up the voltage (113 or 117) applied on the first wire (143), the second voltage driver (145) starts ramping up a voltage (115 or 119) applied on the second wire (143).

For example, the second voltage driver (145) delays ramping up, at time T2 (103), the voltage (115 or 119) applied on the second wire (143), until after the first voltage driver has ramped up (and holds) the voltage (113 or 117) applied on the first wire (141) to above a predetermined voltage (e.g., 1.5V or 2V).

For example, the second voltage driver (145) can delay its voltage ramping-up operation to time T2 (103), such that a time difference between the first voltage driver (147) starting at time T1 (101) to ramp up the voltage on the first wire (141) and the second voltage driver (145) starting at time T2 (103) to ramp up the voltage on the second wire (143) reaches a predetermined time interval T2−T1.

For example, the second voltage driver (145) can delay its voltage ramping-up operation to time T2 (103), after the first voltage driver (147) completes its voltage ramping-up operation, such that the voltage (113 and 117) applied on the first wire (141) is substantially stable, as illustrated in the segments of the waveforms (113 and 117) approaching time T2 (103) in FIG. 2.

For example, one of the first voltage (113 and 117) and the second voltage (115 and 119) is positive; and the other one is negative. During the ramping-up operations, the magnitudes of the first and second voltages increase; and the voltage difference applied on the memory cell (149) across the first and second wires (141 and 143) also increases.

The present disclosure includes methods and apparatuses which perform the methods described above, including data processing systems which perform these methods, and computer readable media containing instructions which when executed on data processing systems cause the systems to perform these methods.

The memory device of FIG. 5 can be used in a data processing system.

A typical data processing system may include an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A device, comprising:
   first wires configured in parallel in a first layer of an integrated circuit die;
   second wires configured in parallel in a second layer of the integrated circuit die;
   first voltage drivers connected to the first wires respectively;
   second voltage drivers connected to the second wires respectively; and
   memory cells formed in an array between the first layer and the second layer, wherein each respective memory cell is configured at a cross point of, and connected to, a third wire among the first wires and a fourth wire among the second wires;
   wherein during an operation to read the respective memory cell, a fourth voltage driver among the second voltage drivers is configured to postpone ramping up a first voltage on the fourth wire at least after a third voltage driver among the first voltage drivers starts ramping up a second voltage on the third wire.

2. The device of claim 1, wherein the fourth voltage driver delays ramping up the first voltage on the fourth wire until after the third voltage driver has ramped up the second voltage on the third wire to above a predetermined voltage.

3. The device of claim 2, wherein during the operation to read the respective memory cell, the fourth voltage driver is configured to start ramping up the first voltage on the fourth wire after the third voltage driver starts ramping up the second voltage on the third wire.

4. The device of claim 3, wherein the second voltage on the third wire is positive; and the first voltage on the fourth wire is negative.

5. The device of claim 4, wherein the fourth voltage driver is configured to start ramping up the first voltage on the fourth wire after a predetermined period from the third voltage driver starting to ramp up the second voltage on the third wire.

6. The device of claim 4, wherein the fourth voltage driver is configured to start ramping up the first voltage on the fourth wire after the third voltage driver completes ramping up the second voltage on the third wire.

7. The device of claim 6, wherein the first wires are bitlines and the second wires are wordlines.

8. The device of claim 7, wherein the respective memory cell is programmable to store data via applying pulses with opposite polarity.

9. The device of claim 8, wherein during the operation to read the respective memory cell, each of the third voltage driver and the fourth voltage driver drives according to a predetermined, fixed polarity.

10. A method, comprising:
    arranging, in a device, first wires in parallel in a first layer of an integrated circuit die, where first voltage drivers are connected to the first wires respectively;
    arranging second wires in parallel in a second layer of the integrated circuit die, where second voltage drivers connected to the second wires respectively; and
    forming memory cells in an array between the first layer and the second layer, wherein each respective memory cell is configured at a cross point of, and connected to, a third wire among the first wires and a fourth wire among the second wires; and
    configuring a fourth voltage driver among the second voltage drivers, to postpone, during an operation to read the respective memory cell, ramping up a first voltage on the fourth wire at least after a third voltage driver among the first voltage drivers starts ramping up a second voltage on the third wire.

11. The method of claim 10, wherein the configuring to postpone comprises configuring the fourth voltage driver to delay ramping up the first voltage on the fourth wire until after the third voltage driver has ramped up the second voltage on the third wire to above a predetermined voltage.

12. The method of claim 11, further comprising:
    configuring the fourth voltage driver is configured to start, during the operation to read the respective memory cell, ramping up the first voltage on the fourth wire after the third voltage driver starts ramping up the second voltage on the third wire.

13. The method of claim 12, wherein the second voltage on the third wire is positive; and the first voltage on the fourth wire is negative.

14. The method of claim 10, wherein the configuring to postpone comprises configuring the fourth voltage driver to start ramping up the first voltage on the fourth wire after at least a predetermined period from the third voltage driver starting to ramp up the second voltage on the third wire.

15. The method of claim 10, wherein the configuring to postpone comprises configuring the fourth voltage driver to start ramping up the first voltage on the fourth wire after the third voltage driver completes ramping up the second voltage on the third wire.

16. The method of claim 10, wherein the first wires are bitlines and the second wires are wordlines.

17. The method of claim 16, further comprising:
    configuring the respective memory cell to be programmed to store data via applying pulses with opposite polarity.

18. The method of claim 17, further comprising:
    configuring the respective memory cell to be read via respective memory cell, each of the third voltage driver and the fourth voltage driver driving according to a predetermined, fixed polarity.

19. A method, comprising:
    driving, using first voltage drivers connected to first wires respectively, wherein the first wires are configured in parallel in a first layer of an integrated circuit die;
    driving, using second voltage drivers connected to second wires respectively, wherein the second wires are configured in parallel in a second layer of the integrated circuit die; and
    reading each respective memory cell in an array of memory cells configured between the first layer and the second layer, via a third voltage driver among the first voltage drivers driving a third wire connected to the respective memory cell and a fourth voltage driver among the second voltage drivers driving a fourth wire connected to the respective memory cell, wherein the fourth voltage driver is configured to postpone ramping up a first voltage on the fourth wire at least after the third voltage driver among the first voltage drivers starts ramping up a second voltage on the third wire.

20. The method of claim 19, further comprising:

starting, by the fourth voltage driver, ramping up the first voltage on the fourth wire after at least one of:
- the third voltage driver has ramped up the second voltage on the third wire to above a predetermined voltage;
- the third voltage driver has completed ramping up second voltage on the third wire; and
- the third voltage driver has started ramping up second voltage for a predetermined period of time.

\* \* \* \* \*